US008283559B2

United States Patent
Yu et al.

(10) Patent No.: US 8,283,559 B2
(45) Date of Patent: Oct. 9, 2012

(54) SILICON-BASED DIELECTRIC STACK PASSIVATION OF SI-EPITAXIAL THIN-FILM SOLAR CELLS

(75) Inventors: Chentao Yu, Sunnyvale, CA (US); Jianming Fu, Palo Alto, CA (US); Jiunn Benjamin Heng, Redwood City, CA (US)

(73) Assignee: Silevo, Inc., Fremont, CA (US)

( * ) Notice: Subject to any disclaimer, the term of this patent is extended or adjusted under 35 U.S.C. 154(b) by 523 days.

(21) Appl. No.: 12/421,470

(22) Filed: Apr. 9, 2009

(65) Prior Publication Data

US 2010/0258168 A1    Oct. 14, 2010

(51) Int. Cl.
*H01L 31/00* (2006.01)
*H01L 31/18* (2006.01)
(52) U.S. Cl. ................ 136/255; 438/72; 257/E21.09
(58) Field of Classification Search ............... None
See application file for complete search history.

(56) References Cited

U.S. PATENT DOCUMENTS

| 3,961,997 | A  | * | 6/1976  | Chu ......................... 438/97 |
| 4,589,191 | A  | * | 5/1986  | Green et al. ............... 438/72 |
| 6,333,457 | B1 | * | 12/2001 | Mulligan et al. .......... 136/255 |
| 2007/0132034 | A1 | * | 6/2007  | Curello et al. ............ 257/374 |
| 2008/0121932 | A1 | * | 5/2008  | Ranade .................... 257/192 |
| 2009/0101872 | A1 | * | 4/2009  | Young et al. .............. 252/514 |

* cited by examiner

*Primary Examiner* — Jennifer Michener
*Assistant Examiner* — Magali P Slawski
(74) *Attorney, Agent, or Firm* — Shun Yao; Park, Vaughan, Fleming & Dowler LLP

(57) ABSTRACT

One embodiment of the present invention provides a solar cell. The solar cell includes a metallurgical-grade Si (MG-Si) substrate, a first layer of heavily doped crystalline-Si situated above the MG-Si substrate, a layer of lightly doped crystalline-Si situated above the first heavily doped crystalline-Si layer, a backside ohmic-contact layer situated on the backside of the MG-Si substrate, a second layer of heavily doped crystalline-Si situated above the lightly doped crystalline-Si layer, a first layer of dielectric situated above the second heavily doped crystalline-Si layer, a second layer of dielectric situated above the first dielectric layer, and front electrodes situated above the second dielectric layer.

10 Claims, 3 Drawing Sheets

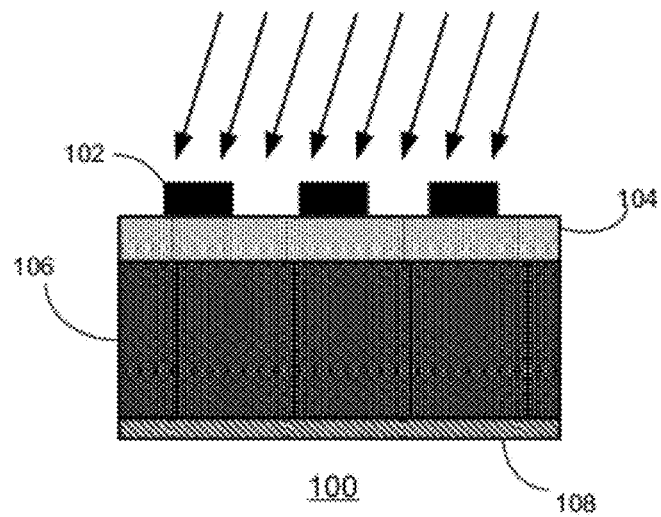
FIG. 1 (PRIOR ART)
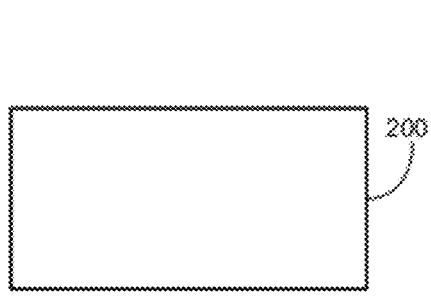
FIG. 2A
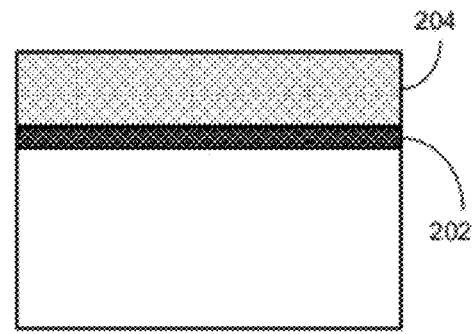
FIG. 2C
FIG. 2B
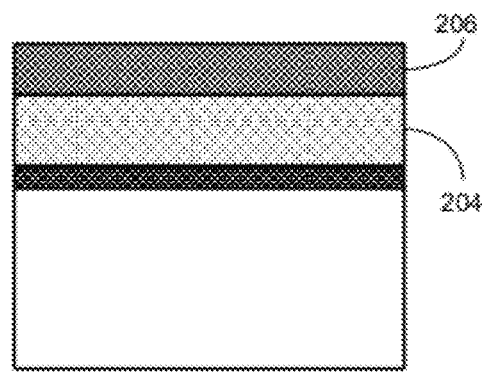
FIG. 2D
FIG. 2

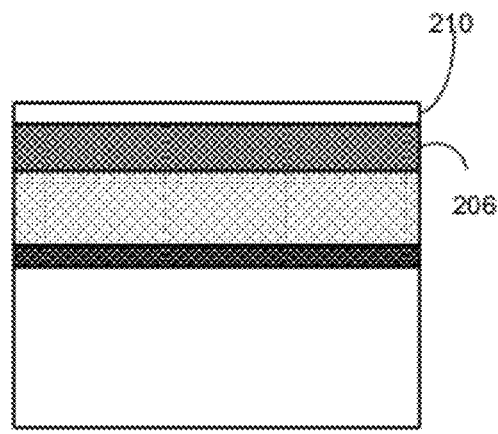
FIG. 2E
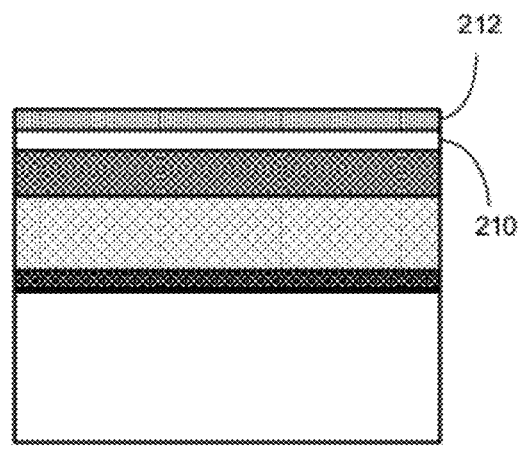
FIG. 2F
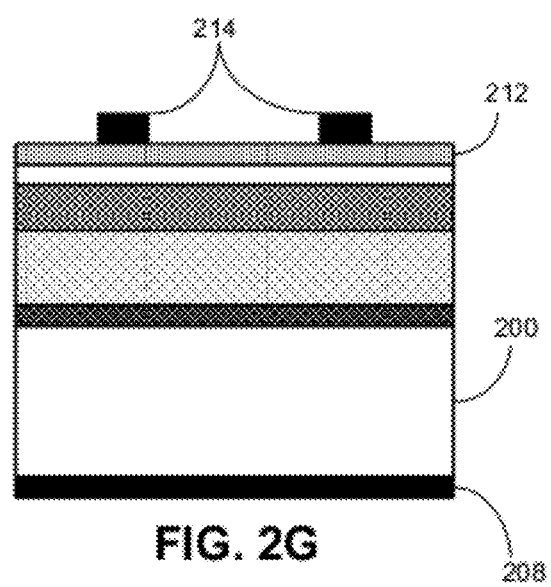
FIG. 2G
FIG. 2 (continued)

SILICON-BASED DIELECTRIC STACK PASSIVATION OF SI-EPITAXIAL THIN-FILM SOLAR CELLS

BACKGROUND

1. Field

This disclosure is generally related to manufacturing a solar cell. More specifically, this disclosure is related to integrating a silicon-based dielectric stack for surface and bulk passivation with screen-printing technology for a Si-epitaxial thin-film solar cell manufacturing application.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal bandgaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi-junction structure includes multiple single-junction structures of different bandgaps stacked on top of one another.

In a solar cell, light is absorbed near the p-n junction, generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

FIG. 1 presents a diagram illustrating an exemplary homojunction solar cell based on a crystalline-Si substrate (prior art). Solar cell 100 includes front electrodes 102, an n$^+$ crystalline-Si emitter layer 104, a p-type doped crystalline-Si substrate 106, and an Al backside electrode 108. Arrows in FIG. 1 indicate incident sunlight. For homojunction solar cells, minority-carrier recombination at the cell surface due to the existence of defect states and dangling bonds can significantly reduce the solar cell efficiency; thus, a good surface passivation process is needed. For conventional homojunction solar cells which use crystalline-Si as an active layer, hydrogen-rich silicon-nitride (SiN$_x$:H) has been widely used as a passivating material. Note that in this type of solar cell, minority carrier recombination inside the bulk Si is the dominant effect, and SiN$_x$:H can effectively passivate the bulk Si by hydrogenation of defects in the bulk Si. Also, the use of SiN$_x$:H can be an adequate technique to passivate the surface of the emitter layer by field-effect passivation.

However, the solar cell demonstrated in FIG. 1 is based on a crystalline-Si substrate whose thickness can be between 200 μm and 300 μm. Due to the soaring cost of Si material, the existence of such a thick crystalline-Si substrate significantly increases the manufacture cost of solar cells; therefore, solar cells based on thin-film technology have been gaining popularity. For a Si thin-film solar cell, the thickness of the Si base film can be between 20 μm and 80 μm, which are typically less than the minority-carrier diffusion length at normal carrier lifetimes. As a result, surface recombination becomes a dominant effect for solar cell efficiency. To achieve high efficiency, the surface recombination velocity (SRV), which is a measure of the minority-carrier surface recombination rate, needs to be less than $1 \times 10^3$ cm/second, and SiN$_x$:H passivation alone has difficulty in accomplishing such a task.

SUMMARY

One embodiment of the present invention provides a solar cell. The solar cell includes a metallurgical-grade Si (MG-Si) substrate, a first layer of heavily doped crystalline-Si situated above the MG-Si substrate, a layer of lightly doped crystalline-Si situated above the first heavily doped crystalline-Si layer, a backside ohmic-contact layer situated on the backside of the MG-Si substrate, a second layer of heavily doped crystalline-Si situated above the lightly doped crystalline-Si layer, a first layer of dielectric situated above the second heavily doped crystalline-Si layer, a second layer of dielectric situated above the first dielectric layer, and front electrodes situated above the second dielectric layer.

In a variation on the embodiment, the solar cell further includes a third dielectric layer situated between the second heavily doped crystalline-Si layer and the first dielectric layer.

In a further variation, the third dielectric layer comprises silicon oxy-nitride (SiO$_x$N$_y$).

In a further variation, the thickness of the third dielectric layer is between 5 Å and 50 Å.

In a variation on the embodiment, the first dielectric layer comprises silicon dioxide (SiO$_2$).

In a further variation, the thickness of the first dielectric layer can be between 10 Å and 300 Å.

In a variation on the embodiment, the second dielectric layer comprises at least one of: SiN$_x$:H, ZnS, and TiO$_2$.

In a further variation, the thickness of the second dielectric layer can be between 500 Å and 1000 Å, and the second dielectric layer can serve as an anti-reflective layer.

In a variation on the embodiment, the front electrodes are formed using screen-printing and firing of Ag paste or aerosol printing and firing of Ag ink with glass frit.

In a variation on the embodiment, the first heavily doped crystalline-Si layer and the lightly doped crystalline-Si layer are p-type doped, and the second heavily doped crystalline-Si layer is n-type doped.

In a variation on the embodiment, the first and second heavily doped crystalline-Si layers and the lightly doped crystalline-Si layer are deposited using a chemical-vapor-deposition (CVD) technique.

In a variation on the embodiment, the second heavily doped crystalline-Si layer is formed using a CVD technique.

In a variation on the embodiment, the second heavily doped crystalline-Si layer is formed by diffusing dopants.

BRIEF DESCRIPTION OF THE FIGURES

FIG. 1 presents a diagram illustrating an exemplary homojunction solar cell based on a crystalline-Si substrate (prior art).

FIG. 2 presents a diagram illustrating the process of fabricating a solar cell in accordance with an embodiment of the present invention.

In the figures, like reference numerals refer to the same figure elements.

DETAILED DESCRIPTION

Figure 3:
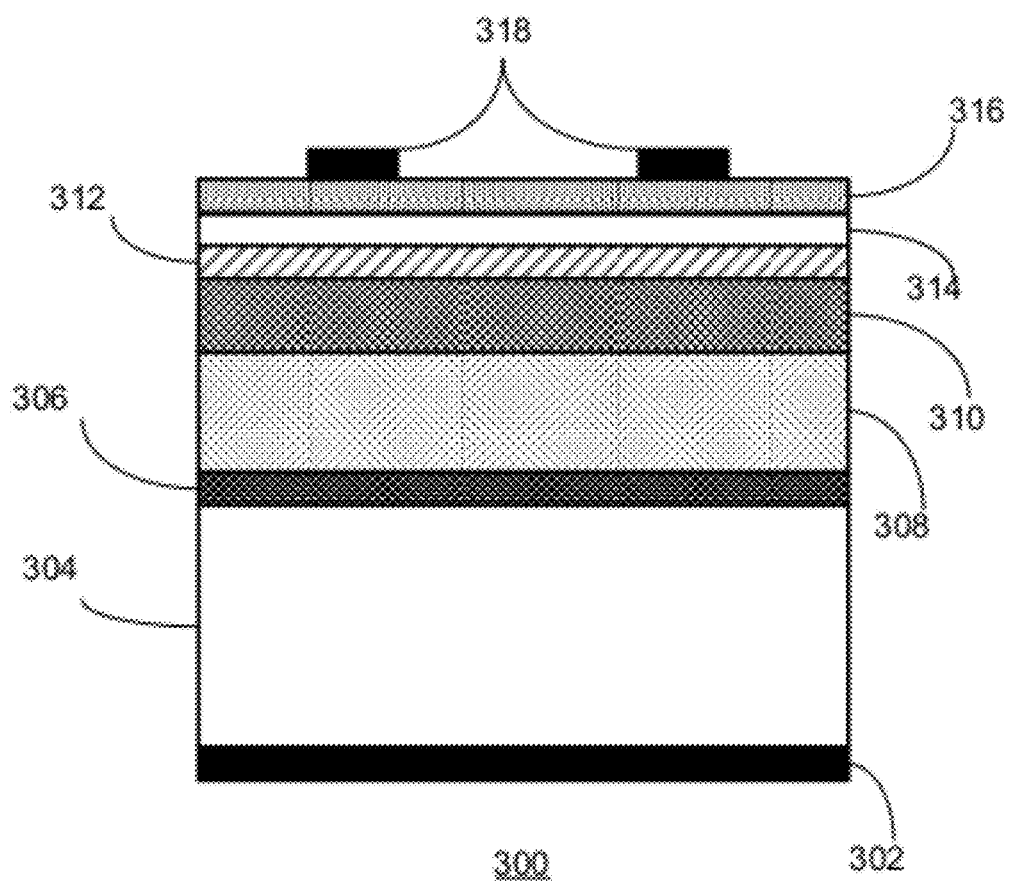
FIG. 3 presents a diagram illustrating an exemplary solar cell in accordance with an embodiment of the present invention.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a solar cell using a two/three-layer dielectric stack for passivation and anti-reflection. A thin layer of heavily p-type doped crystalline-Si is deposited on a metallurgical-grade Si (MG-Si) substrate forming a back-surface-field (BSF) layer, and a thin layer of lightly p-type doped crystalline-Si is deposited on the BSF layer to form a base layer. The emitter layer can be formed by depositing a heavily n-type doped crystalline-Si layer or by diffusing n-type dopants, such as phosphorous, at a high temperature. A dielectric layer stack that includes one or more of silicon oxy-nitride ($SiO_xN_y$), silicon-dioxide ($SiO_2$), and hydrogen-rich silicon-nitride ($SiN_x:H$) is used for passivation and anti-reflection. Instead of using a photolithography technique, front electrodes can be formed by screen-printing and firing of Ag paste, or by aerosol-jet printing and firing of the Ag ink.

Fabrication Process

FIG. 2 presents a diagram illustrating the process of fabricating a solar cell in accordance with an embodiment of the present invention.

In operation 2A, a MG-Si substrate 200 is prepared. Because MG-Si is much cheaper than crystalline-Si, solar cells based on MG-Si substrates have a significantly lower manufacture cost. The purity of MG-Si is usually between 98% and 99.99%. To ensure a high efficiency of the subsequently fabricated solar cell, the starting MG-Si substrate ideally has a purity of 99.9% or better. In addition, the surface of the MG-Si substrate needs to be further purified. In one embodiment, MG-Si substrate 200 is baked at a temperature between 1100° C. and 1250° C. in a chemical-vapor-deposition (CVD) chamber filled with hydrogen ($H_2$) in order to remove native silicon-oxide in the substrate. Afterwards, at the same temperature, hydrogen chloride (HCl) gas is introduced inside the CVD chamber to leach out any residual metal impurities from MG-Si substrate 200, thus further preventing the impurities from diffusing into the subsequently grown crystalline-Si thin films. Due to the fact that metal impurities, such as iron, have a high diffusion coefficient at this temperature, the metal impurities tend to migrate to the surface of substrate 200, and react with the HCl gas to form volatile chloride compounds. The volatile chloride compounds can be effectively purged from the chamber using a purge gas, such as $H_2$. Note that the metal-impurity leaching process can be carried out either in the CVD chamber, which is subsequently used for the growth of crystalline-Si thin films, or in another stand-alone furnace. The metal-impurity leaching process can take between 1 minute and 120 minutes. MG-Si substrate 200 can be either p-type doped or n-type doped. In one embodiment, MG-Si substrate 200 is p-type doped.

In operation 2B, a thin layer of heavily doped (with a doping concentration of greater than $1 \times 10^{17}/cm^3$) crystalline-Si film 202 is epitaxially grown on the surface of MG-Si substrate 200. Various methods can be used to epitaxially grow crystalline-Si thin film 202 on MG-Si substrate 200. In one embodiment, crystalline-Si thin film 202 is grown using a CVD process, such as plasma-enhanced CVD (PECVD). Various types of Si compounds, such as $SiH_4$, $SiH_2Cl_2$, and $SiHCl_3$, can be used in the CVD process to form crystalline-Si thin film 202. In one embodiment, $SiHCl_3$ (TCS) is used due to its abundance and low cost. Crystalline-Si thin film 202 can be either p-type doped or n-type doped. In one embodiment, boron is added to make thin film 202 p-type doped. The doping concentration of thin film 202 can be between $1 \times 10^{17}/cm^3$ and $1 \times 10^{20}/cm^3$, and the thickness of thin film 202 can be between 1 μm and 8 μm. Crystalline-Si thin film 202 is heavily doped to act as back-surface field (BSF) and barrier for minority carriers, hence reducing minority carrier recombination at the back surface of the subsequently grown base film.

In operation 2C, a layer of lightly doped (with a doping concentration of less than $5 \times 10^{17}/cm^3$) crystalline-Si base film 204 is epitaxially grown on top of thin film 202. The growing process of base film 204 can be similar to that used for thin film 202. Similarly, base film 204 can be either p-type doped or n-type doped. In one embodiment, base film 204 is lightly doped with a p-type dopant, such as boron. The doping concentration of base film 204 can be between $5 \times 10^{15}/cm^3$ and $5 \times 10^{17}/cm^3$, and the thickness of base film 204 can be between 5 μm and 100 μm. Note that compared with a conventional bulk solar cell that uses a crystalline-Si wafer as a base layer, embodiments of the present invention use an epitaxially grown crystalline-Si film as a base layer, which can be much thinner than a crystalline-Si wafer. As a result, the manufacture cost of solar cells can be significantly reduced. After deposition, the surface of base film 204 can be textured to maximize light absorption inside the solar cell, thus further enhancing efficiency.

In operation 2D, a thin layer of heavily doped crystalline-Si film is formed on base film 204 to form an emitter layer 206. Depending on the doping type of base film 204, emitter layer 206 can be either n-type doped or p-type doped. In one embodiment, emitter layer 206 is heavily doped with an n-type dopant, such as phosphorus. The doping concentration of emitter layer 206 can be between $5 \times 10^{17}/cm^3$ and $5 \times 10^{20}/cm^3$. In one embodiment, emitter layer 206 can be formed by diffusing ions in a diffusion chamber or by in-situ doping in the CVD chamber where base film 204 is formed. In an alternative embodiment, emitter layer 206 can be formed using a CVD process, such as PECVD.

In operation 2E, a thin layer of thermal oxide (layer 210) is formed on top of emitter layer 206. Thermal-oxide layer 210 can be formed using different oxidation techniques including dry oxidation, rapid thermal oxidation (RTO), and wet oxidation. For example, thermal-oxide layer 210 can include a thin layer of $SiO_2$, which can be formed by flowing oxygen ($O_2$) over the surface of emitter layer 206 at a high temperature between 700° C. and 1050° C. The thickness of thermal-oxide layer 210 can be between 10 Å and 300 Å, preferably between 100 Å and 200 Å. Thermal-oxide layer 210 can further reduce minority-carrier surface recombination, because the oxide growth can effectively remove Si surface interstitial defects, thus passivating the dangling bonds.

In operation 2F, a relatively thick layer of $SiN_x$:H (layer 212) is deposited on top of thermal-oxide layer 210. Techniques used for depositing $SiN_x$:H layer 212 include, but are not limited to: PECVD, sputtering, and electron beam (e-beam) evaporation. In addition to passivation by hydrogenation and surface field effect, $SiN_x$:H layer 212 also acts as an anti-reflective layer. In order to reduce light reflection effectively, $SiN_x$:H layer 212 has a thickness between 500 Å and 1000 Å. In addition to $SiN_x$:H, other materials, such as ZnS and $TiO_2$ can also be used to form an anti-reflective layer.

In operation 2G, front electrodes 214 are formed on top of $SiN_x$:H layer 212, and a backside electrode 208 is formed on the backside of MG-Si substrate 200. Traditionally, in order to form a good ohmic contact between front electrodes 214 and emitter layer 206, photolithography is needed to open a window in thermal oxide layer 210 and $SiN_x$:H layer 212. Such a lithographic process is expensive and is not suitable for low-cost, large-scale solar cell manufacture. When firing at a high temperature, Ag paste can etch through thermal oxide layer 210 and $SiN_x$:H layer 212 to make a good ohmic contact with emitter layer 206. In one embodiment of the present invention, front electrodes 214 are formed by screen printing Ag paste and firing it at a high temperature between 700° C. and 900° C. In an alternative embodiment, front electrodes 214 can also be formed by aerosol jet printing Ag ink with glass frit first, and then firing it at a high temperature between 700° C. and 900° C. In one embodiment, to form electrode 208, a layer of aluminum (Al) paste is coated on the backside of MG-Si substrate 200. To form an ohmic contact between electrode 208 and substrate 200, the Al paste on the backside is co-fired with front electrodes 214 at a temperature of above 500° C.

In another embodiment of the present invention, instead of using a two-layer dielectric stack for passivation and anti-reflection, a three-layer dielectric stack is used. FIG. 3 presents a diagram illustrating an exemplary solar cell in accordance with an embodiment of the present invention. Solar cell 300 includes a backside electrode 302, a MG-Si substrate 304, a heavily doped crystalline-Si BSF layer 306, a lightly doped crystalline-Si base film 308, a heavily doped crystalline-Si emitter layer 310, an ultra-thin silicon oxy-nitride ($SiO_xN_y$) layer 312, a thermal-oxide layer 314, a $SiN_x$:H layer 316, and front electrodes 318. The fabrication process of solar cell 300 is similar to the one shown in FIG. 2 except that when fabricating solar cell 300, an ultra-thin $SiO_xN_y$ layer 312 is formed on top of emitter layer 310. $SiO_xN_y$ layer 312 can further improve the emitter passivation, because in addition to passivating the existing dangling Si interstitial bonds, $SiO_xN_y$ layer 312 can relax the interfacial stress between emitter layer 310 and thermal-oxide layer 314. $SiO_xN_y$ layer 312 can be formed by switching the gas flow from $O_2$ to $N_2O$, NO, or $NH_3$ in-situ during thermal oxidization, or be formed in a separate Rapid Thermal Process (RTP) equipment chamber by flowing $N_2$ gas. These thermal oxynitridation processes occur at a high temperature between 700° C. and 1100° C. and result in an ultra-thin (thickness between 0.5 nm and 5 nm) layer of $SiO_xN_y$ with a nitrogen content in the range between $1\times10^{14}$ atoms/cm$^2$ and $3\times10^{15}$ atoms/cm$^2$). Note that oxidation of silicon and annealing of $SiO_2$ in an environment of $N_2O$ or NO are the leading hydrogen-free (trap-free) processing methods for growing a high-quality $SiO_xN_y$ interfacial layer between the $SiO_2$ layer and the Si active region.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A solar cell, comprising:
a metallurgical-grade Si (MG-Si) substrate;
a first heavily doped crystalline-Si layer situated above the MG-Si substrate;
a lightly doped crystalline-Si layer situated above the first heavily doped crystalline-Si layer;
a second heavily doped crystalline-Si layer situated above the lightly doped crystalline-Si layer;
front electrodes situated above the second heavily doped crystalline-Si layer;
a passivation layer situated between the second heavily doped crystalline-Si layer and the front electrodes, wherein the passivation layer passivates a surface of the second heavily doped crystalline-Si layer, wherein the passivation layer includes a three-layer dielectric stack, wherein the three-layer dielectric stack includes a $SiO_xN_y$ layer in contact with the second heavily doped crystalline-Si layer, a hydrogenated $SiN_x$ layer in contact with the front electrodes, and a oxide layer situated between the $SiO_xN_y$ layer and the hydrogenated $SiN_x$ layer, and wherein the $SiO_xN_y$ layer relaxes interfacial stress between the second heavily doped crystalline-Si layer and the oxide layer; and
a backside ohmic-contact layer situated on the backside of the MG-Si substrate.

2. The solar cell of claim 1, wherein the thickness of the $SiO_xN_y$ layer is between 5 Å and 50 Å.

3. The solar cell of claim 1, wherein the oxide layer comprises silicon dioxide ($SiO_2$).

4. The solar cell of claim 3, wherein the thickness of the $SiO_2$ layer can be between 10 Å and 300 Å.

5. The solar cell of claim 1, wherein the thickness of the hydrogenated $SiN_x$ layer can be between 500 Å and 1000 Å, and wherein the hydrogenated $SiN_x$ layer can serve as an anti-reflective layer.

6. The solar cell of claim 1, wherein the front electrodes are formed using:
screen-printing and firing of Ag paste; or
aerosol printing and firing of Ag ink with glass frit.

7. The solar cell of claim 1, wherein the first heavily doped crystalline-Si layer and the lightly doped crystalline-Si layer are p-type doped, and wherein the second heavily doped crystalline-Si layer is n-type doped.

8. The solar cell of claim 1, wherein the first heavily doped crystalline-Si layer and the lightly doped crystalline-Si layer are deposited using a chemical-vapor-deposition (CVD) technique.

9. The solar cell of claim 1, wherein the second heavily doped crystalline-Si layer is formed using a CVD technique.

10. The solar cell of claim 1, wherein the second heavily doped crystalline-Si layer is formed by diffusing dopants.

* * * * *